(12) United States Patent
Peukert

(10) Patent No.: US 8,485,059 B2
(45) Date of Patent: Jul. 16, 2013

(54) ACTUATING DEVICE HAVING FORCE-FEEDBACK

(75) Inventor: Andreas Peukert, Barnstorf (DE)

(73) Assignee: ZF Friedrichshafen AG, Friedrichshafen (DE)

(*) Notice: Subject to any disclaimer, the term of this patent is extended or adjusted under 35 U.S.C. 154(b) by 50 days.

(21) Appl. No.: 13/191,654

(22) Filed: Jul. 27, 2011

(65) Prior Publication Data

US 2011/0296943 A1 Dec. 8, 2011

Related U.S. Application Data

(63) Continuation of application No. PCT/DE2010/050003, filed on Feb. 4, 2010.

(51) Int. Cl.
*B60K 17/04* (2006.01)
*B60K 17/12* (2006.01)

(52) U.S. Cl.
USPC ........................................ 74/473.12

(58) Field of Classification Search
USPC ............... 74/473.12, 473.21, 473.23, 473.3
See application file for complete search history.

(56) References Cited

U.S. PATENT DOCUMENTS

| | | | |
|---|---|---|---|
| 6,448,670 B1 * | 9/2002 | Onodera et al. | 307/10.1 |
| 6,508,139 B2 | 1/2003 | Onodera | |
| 6,591,175 B2 | 7/2003 | Numata et al. | |
| 6,999,251 B2 | 2/2006 | Kao et al. | |
| 2004/0011152 A1 | 1/2004 | Danielsson et al. | |
| 2005/0247154 A1 | 11/2005 | Osamura et al. | |
| 2006/0283279 A1 | 12/2006 | Levin et al. | |
| 2009/0000413 A1 | 1/2009 | Furhoff et al. | |
| 2010/0212447 A1 | 8/2010 | Giefer et al. | |
| 2011/0056318 A1 | 3/2011 | Rake et al. | |

FOREIGN PATENT DOCUMENTS

| | | |
|---|---|---|
| DE | 102005001589 | 8/2006 |
| DE | 102005061285 A1 | 6/2007 |
| EP | 1182381 A2 | 2/2002 |
| EP | 1220068 A2 | 7/2002 |
| JP | 2004092151 A | 3/2004 |
| WO | 2009138079 | 11/2009 |

OTHER PUBLICATIONS

International Search Report dated Jun. 9, 2010.

* cited by examiner

*Primary Examiner* — Justin Krause
(74) *Attorney, Agent, or Firm* — Norris McLaughlin & Marcus, P.A.

(57) ABSTRACT

The invention relates to an actuation device for a shift-by-wire-actuated gearshift transmission. It includes a shifter base and an actuating element pivotally supported in a bearing location of the shifter base. The actuation device further includes at least one actuator for blocking the actuation element. Here, the actuator, in addition to its blocking function, is configured for generating mechanical vibrations or oscillations. A tactile feedback for the user of the actuation device with low design complexity is provided for flexible, tactile signaling of switching processes or locked actuation positions of a selection lever. Existing actuation devices can potentially be upgraded for tactile feedback purely by software-side changes.

6 Claims, 1 Drawing Sheet

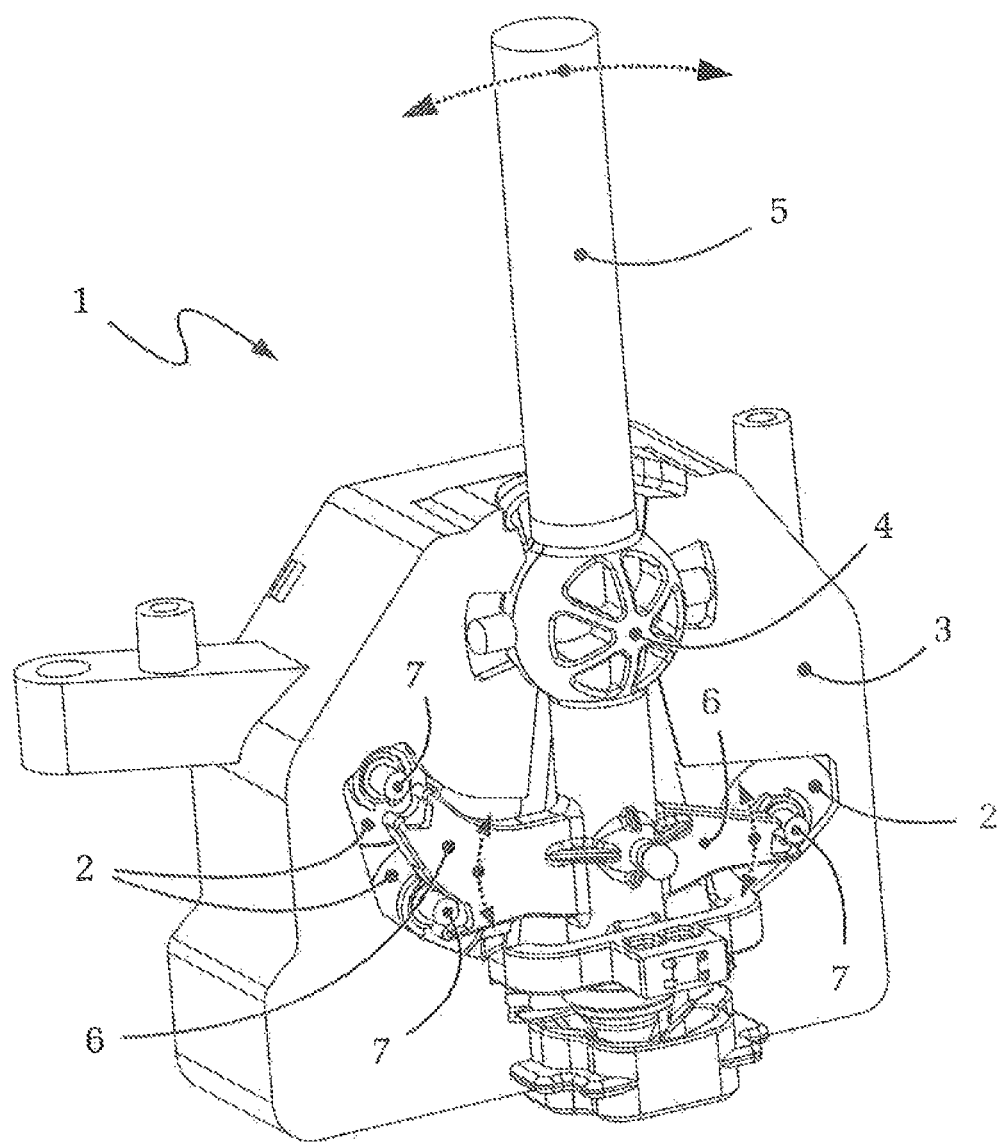

ACTUATING DEVICE HAVING FORCE-FEEDBACK

This is a continuation application of PCT/DEDE2010/050003, filed on Apr. 2, 2010 and claiming priority to DE 10 2009 000 640.0 filed on Feb. 5, 2009.

BACKGROUND OF THE INVENTION (1) Field of the Invention

The invention relates to an actuating device for a gear-changing transmission, for example for a gearbox or for an automatic transmission with shift-by-wire actuation, according to the preamble of claim 1.

(2) Description of Related Art

Gear-changing transmissions for automobiles are generally shifted or controlled with an operating device arranged within the reach of the operator. Typically, actuating elements, such as shift levers or selection levers, are used which are arranged, for example, between the front seats of the automobile or in other areas of the cockpit.

In particular, ergonomic and safety reasons demand that presently impermissible shift positions or the execution of the demanded shifting actuation, is haptically indicated to the operator in form of corresponding shifting resistances or interlocks on the shift lever. Only in this manner can a haptic shifting actuation be realized, like an actuation the operator is familiar with or used to, for example from fully synchronized mechanical gearboxes with their rotation-speed and vehicle-speed dependent synchronized interlocks, or from the conventional actuation of an automatic transmission with its locking mechanism and its gear shift locks.

It is therefore always necessary to transmit to the operator during actuation of the transmission an unambiguous tactile feedback about the actual shift or operating state of the transmission or about the shifting success.

However, with electrical or shift-by-wire actuation of gear-changing transmissions, there is no longer a mechanical coupling between the shift lever in the passenger compartment and the automobile transmission in the engine compartment. Instead, the shift commands in the "shift-by-wire" transmission are transmitted from the actuating device to the automobile transmission by way of electrical or electronic signals and subsequent predominantly electro-hydraulic conversion of the shift commands on the transmission.

Due to the absence of a mechanical linkage between the transmission actuators and the actuating lever, the state of the transmission, any gear shift locks or impermissible shift commands can no longer provide direct feedback about the position of the actuating lever so as to be perceptible by the operator.

With shift-by-wire-controlled transmissions, the driver is therefore unable to easily recognize, based on certain shift positions which are perceptibly blocked on the shift lever, that shift lever positions, gear positions and/or shift commands may not be allowed under the current driving conditions and should therefore also not be selected. Likewise, with shift-by-wire actuation, the actual execution of the operator's shift commands by the transmission is also not fed back to the shift lever, so that the operator is unable to haptically sense the execution of the shifting actuation in the same way he is used to, for example, from mechanically operated gearboxes with their locking mechanism and gear synchronizing locks.

Depending on the state of the gear-changing transmission to be operated and depending on other conditions on the automobile—e.g., engine rpm, vehicle speed, clutch position, etc.—, it is therefore necessary for realizing the required haptic feedback with shift-by-wire-controlled transmissions to limit or delay the movement of the shift lever under active control or to generally introduce actuating forces into the lever—much like a Force Feedback.

Only in this way can the operator receive haptic feedback with a shift-by-wire-controlled transmission, when he touches the actuating lever, indicating that the desired gear shift is not permitted—for example, based on the actual vehicle speed or based on a current operating state of the gear-changing transmission—and is therefore blocked. This can prevent impermissible shift commands, which are recognized by the electronics unit of the transmission and therefore not transmitted from the operating device to the transmission, from being engaged on the shift lever.

As seen from the example described in DE 10 2005 001 589 B3, it is known in the state of the art to implement the haptics corresponding to an actuating element with mechanical force transmission in a shift-by-wire switched gear-changing transmission by providing the actuating element with an electronically controllable blocking actuator. The blocking actuator is controlled with a control device so that currently impermissible shift states are noticeably blocked and can therefore not be selected by the operator.

However, such actuating devices with blocking actuators are not optimal for providing a realistic haptic experience, because the actuating lever can only be either completely blocked by the blocking actuator or completely unblocked. A more realistic haptic which better corresponds to a mechanical force transmission to the gear-changing transmission—in particular with respect to force feedback—cannot be accomplished with the conventional use of blocking actuators. It is merely haptically transmitted to the operator on the shift lever that the shift lever is either freely movable (blocking actuator deactivated), or that certain switch positions are completely blocked (blocking actuator activated).

In particular, conventional blocking actuators are unable to provide gradual haptic signaling (which increases with the excursion) of actual blocking of a certain shift position—depending on the traveled distance of the hand of the operator on the switch lever—, because the conventional blocking actuators only recognize two states, namely "actuating position blocked" or "actuating position unblocked."

On the other hand, conventional actuating devices with force feedback frequently have disadvantages because the components required for realizing the force feedback must generally be mounted as an additional assembly in the region of the actuating lever or in the housing of the actuating device. This increases the structural complexity and requires separate installation space which is frequently not available in view of the increasingly smaller actuating elements for modern automobile transmissions. In addition, conventional force feedback devices always require a dedicated actuator drive which not only requires additional space, but also consumes additional energy and hence produces more heat.

BRIEF SUMMARY OF THE INVENTION

With this background, it is an object of the present invention to provide an actuating device with an actuating element—in particular for electric and/or electronic shift-by-wire actuation of a gear-changing transmission—, which is capable of overcoming the aforementioned disadvantages of the state-of-the-art. The actuating device should take up little space, have a simple design and should be manufacturable at low cost, and should attain reliable and realistic haptic signaling of shift actuations or blocked operating positions.

This object is attained by an actuating device having the features of claim 1.

Preferred embodiments are recited in the dependent claims.

In an initially conventional manner, the actuating device according to the present invention includes a shifter base and an actuating element, for example an actuating lever, wherein the actuating element can be rotated or pivoted about a bearing arranged on the shifter base. In a likewise conventional manner, the actuating device furthermore includes an actuator which is used, for example, to block the actuating element with the actuator in one or several shift positions.

According to the invention, the actuating device is characterized in that the actuator is configured—in addition to its blocking function with respect to the actuating element—to generate mechanical oscillations or vibrations.

In this way, the actuator can produce oscillations or vibrations which are then transmitted to the actuating element and/or the selection lever via the shifter base and the bearing, where they can be haptically sensed by the operator operating of the selection lever. The operator can hence receive a haptic signal, in particular already during an attempt to move the selection lever in the direction of a currently impermissible shift position, indicating that an attempt is made to initiate an impermissible shifting operation that cannot be executed in the present operating state of the gear-changing transmission.

The invention therefore has the important advantage that no additional actuator drive is required for realizing an active force feedback, and the actuating device also need not even undergo appreciable modifications. Instead, with the invention, already existing blocking actuators of almost any design can be employed in such dual function—for blocking the actuating element and also for generating force feedback.

With the invention, an existing actuating device therefore does not need to be modified at all (or only minimally) so as to be equipped with the proactive force feedback according to the invention. With the invention, already installed actuating devices without force feedback can be provided with force feedback functionality—with only a software update.

The invention can initially be implemented regardless of how the actuator is constructed and arranged, as long as the actuator is under suitable control configured to produce vibrations or oscillations. According to a particularly preferred embodiment of the invention, the actuator is formed by an electromagnet. An electromagnetic actuator is primarily space-saving and reliable and can be realized with low energy consumption. In the context of the invention, an electromagnetic actuator is advantageous in that oscillations and vibrations can be readily generated by controlling the actuator with AC current or with pulsating DC current.

With this background, according to another preferred embodiment of the invention, the actuator is controlled using pulse-width modulation.

A pulse-width-modulated signal can be produced with a simple circuit and without significant heat dissipation by the switching circuitry. In addition, a large variety of signal shapes and frequencies can be realized. Moreover, an additional signal having a lower frequency can be modulated onto the pulse-width-modulated signal, allowing the generation of characteristic, and optionally different, signal shapes which transmit to the operator corresponding characteristic and optionally different haptic signals. For example, a presently completely blocked shift position (e.g., the reverse gear when traveling forward at high speed) can be associated with a different vibration pattern than a shift position which, although currently permissible, would result in increased fuel consumption (for example a gear position with excessive engine rpm).

According to another embodiment of the invention, the actuating device includes at least two actuators. The actuator which is currently not used for blocking the selection lever is used for generating the mechanical oscillations or vibrations.

In this way, oscillations or vibrations can be reliably produced and transmitted to the actuating element even if one of the actuators is already used—for example for blocking a presently impermissible shift position of the actuating element or selection lever—and is therefore unable to also generate simultaneously the desired oscillations or vibrations. This is particularly the case when the operator or driver pushes quite strongly against the shift lock currently formed by one actuator. For example, the armature element of an electromagnetic actuator could then be temporarily jammed and blocked, which would prevent this actuator from generating oscillations or vibrations. In this case, the second actuator not currently used for a blocking function can be used for reliably generating the oscillations or vibrations.

BRIEF DESCRIPTION OF THE SEVERAL VIEWS OF THE DRAWING(S)

The invention will now be described in more detail with reference to drawing which only illustrates an exemplary embodiment. The sole FIGURE shows in:

FIG. 1 a diagram of an embodiment of the actuating device according to the present invention.

DETAILED DESCRIPTION OF THE INVENTION

FIG. 1 shows an initially conventional design of an actuating device 1 with three blocking actuators 2.

FIG. 1 also illustrates a shifter base 3—which can be connected, for example, with the floor of the automobile body—, wherein one housing half has been removed in the diagram of FIG. 1 to show the interior structure of the actuating device 1. An actuating lever 5, which can be moved forward and backward along the dotted double allow in the direction of travel, is connected with the shifter base 3 by way of a ball joint 4.

Also arranged in the shifter base 3 are total of three electromagnetic actuators 2, with each of the actuators capable of interacting with locking extensions 6, wherein the locking extensions 6 are formed in one piece with the selection lever 5. Depending on the control of the three electromagnetic actuators 2, a corresponding number of armature element pins 7 of the actuators 2 is extended, and the movement angle of the corresponding locking extension 6 (and hence also of the actuating lever) is commensurately limited or reduced. In this way, certain shift positions or shift angle regions of the actuating lever 5 can be selectively blocked—through corresponding control of the actuators 2.

According to the invention, one or more of the actuators 2 are additionally controlled such that AC current of suitable amplitude and frequency, or pulsating DC current, in particular in form of pulse-width modulation, can be applied to the actuators 2.

In this way, corresponding oscillations or vibrations, which propagate to the selection lever 5 via the shifter base 3 of the actuating device 1 and via the ball joint 4, are generated in one or more of the actuators 2.

In other words, the illustrated actuating device 1—which in its conventional form initially does not offer force feedback aside from merely blocking impermissible shift positions—can be converted essentially without any structural changes into an actuating device with comprehensive, proactive or variable force feedback functionality. In the simplest case, this can be attained in form of only a software update, which is loaded into the control circuitry of the actuating device 1 for the actuators 2.

As a result, the invention provides an actuating device with force feedback, in particular for shift-by-wire-operated gear-changing transmissions, capable of significantly improving the haptic feedback for the operator or driver with a minimum of structural complexity, in particular by using flexible haptic signaling of shift processes or blocked actuating positions. In this way, the haptic and the motion properties of an actuating device for a gear-changing transmission can be broadly altered—even with software alone—and adapted to the specific application or the user preferences.

The invention therefore makes a significant contribution to improving the ergonomics, the operating comfort and the cost-effectiveness, in particular for applications in the field of actuation of shift-by-wire-controlled transmissions of automobiles.

LIST OF REFERENCES SYMBOLS

1 Actuating device
2 Magnetic actuator
3 Shifter base
4 Ball joint
5 Shift lever, selection lever
6 Locking extension
7 Magnet armature element

The invention claimed is:

1. An actuating device for selecting shift steps of a shift-by-wire gear-changing transmission, the actuating device comprising:
   a shifter base,
   a mechanical actuating element, which is rotatably or pivotally supported in a bearing of the shifter base, as well as at least one armature element which is moved back and forth by at least one actuator between an activated state, wherein the mechanical actuating element is blocked along at least one actuating direction through a stop on the at least one armature element, and a deactivated state, wherein the mechanical actuating element moveable along at least one actuating direction past the armature element,
   wherein each of the at least one actuator is configured, in addition to its movement function for the at least one armature element, to generate mechanical oscillations or vibrations.

2. The actuating device according to claim 1, wherein the at least one actuator is formed by an electromagnet.

3. The actuating device according to claim 1, wherein control of the at least one actuator is implemented using a pulse-width-modulated signal.

4. The actuating device according to claim 1, wherein the actuating device comprises at least two actuators, wherein one of the at least two actuators that is currently not used for moving or blocking the mechanical actuating element is configured to generate the mechanical oscillations or vibrations.

5. The actuating device according to claim 1, wherein the mechanical actuating element is an actuating lever.

6. The actuating device according to claim 1, wherein each of the at least one actuator performs a dual functionality of blocking the mechanical actuating element and generating force feedback.

* * * * *